(12) United States Patent
Nishiki et al.

(10) Patent No.: US 6,261,144 B1
(45) Date of Patent: Jul. 17, 2001

(54) WIRING SUBSTRATE AND GAS DISCHARGE DISPLAY DEVICE AND METHOD THEREFOR

(75) Inventors: Masashi Nishiki; Ryohei Satoh, both of Yokohama; Yuzo Taniguchi, Kodaira; Shigeaki Suzuki, Fujisawa; Michifumi Kawai, Tokyo; Masahito Ijuin, Fujisawa; Akira Yabushita; Makoto Fukushima, both of Yokohama; Tomohiko Murase, Kawasaki, all of (JP)

(73) Assignee: Hitachi, LTD, Tokyo (JP)

( * ) Notice: Subject to any disclaimer, the term of this patent is extended or adjusted under 35 U.S.C. 154(b) by 0 days.

(21) Appl. No.: 09/164,272

(22) Filed: Oct. 1, 1998

(30) Foreign Application Priority Data

Oct. 3, 1997 (JP) .................................................... 9-270795

(51) Int. Cl.$^7$ ................................ H01J 9/00; H01J 9/24; H01J 9/04; H01J 9/12; H01J 9/14
(52) U.S. Cl. ............................... 445/24; 445/46; 216/23; 216/102; 438/754
(58) Field of Search ..................................... 313/582, 585, 313/586, 587; 445/24, 46–47, 59, 73; 315/111.21; 427/532, 534, 541, 560, 569, 457; 216/13, 23, 40–41, 57, 102; 438/233, 586, 630, 649, 609, 673, 713, 719

(56) References Cited

U.S. PATENT DOCUMENTS

| | | | |
|---|---|---|---|
| 4,454,449 | * 6/1984 | Hall | 313/586 X |
| 4,746,219 | * 5/1988 | Holloway et al. | 216/57 X |
| 5,234,541 | * 8/1993 | Shannon et al. | 216/13 |
| 5,536,466 | 7/1996 | Ogawa et al. | |
| 5,703,437 | * 12/1997 | Komaki | 313/586 X |
| 5,783,906 | * 7/1998 | Moore et al. | 313/586 |
| 5,939,827 | * 8/1999 | Hinchliffe | 313/587 X |
| 5,952,781 | * 9/1999 | Wang et al. | 313/587 X |
| 5,968,850 | * 10/1999 | Jeong et al. | 438/754 |
| 6,001,539 | * 12/1999 | Lyu et al. | 216/23 X |
| 6,150,762 | * 11/2000 | Kim et al. | 445/46 X |

FOREIGN PATENT DOCUMENTS

0 199 300    10/1986    (EP) .

* cited by examiner

Primary Examiner—Kenneth J. Ramsey
Assistant Examiner—Mack Haynes
(74) Attorney, Agent, or Firm—Antonelli, Terry, Stout & Kraus, LLP

(57) ABSTRACT

A gas discharge display device comprising a front side substrate having a plurality of first electrodes and a back side substrate having a plurality of second electrodes, wherein at least said first electrodes or second electrodes are formed by wet etching using a resist made of an inorganic material, is excellent in the ability to suppress the breakage of wiring in electrodes.

24 Claims, 11 Drawing Sheets

WIRING SUBSTRATE AND GAS DISCHARGE DISPLAY DEVICE AND METHOD THEREFOR

BACKGROUND OF THE INVENTION

This invention relates to a wiring substrate comprising a wiring substrate with a wiring pattern formed thereon, a gas discharge display device using the same , and a method therefor.

Gas discharge display devices such as plasma display and the like make display through a self-luminescence, and therefore are characterized in that the field angle is large, the display is easy to see, the thickness can be lessened, and a large picture plane can be realized. Thus, such gas discharge display devices have become applied to display devices of information terminal equipment and high-quality picture tubes of television. Plasma displays are roughly classified into direct current driving type and alternate current driving type. Among them, the alternate current type of plasma display shows a high luminance owing to the memory action of dielectric layer covering electrodes, and its lifetime has reached a practical level through formation of protective layer. This results in practical application of plasma displays to video monitors for many uses.

FIG. 9 is a perspective view illustrating the structure of a practical plasma display panel, wherein the front side substrate 100 is shown apart from the back side substrate 200 for the purpose of facilitating understanding.

The front side substrate 100 comprises a display electrode 600 made of a transparent conductive material such as ITO (indium tin oxide), tin oxide ($SnO_2$) or the like, a bus electrode 700 made of a low-resistance material, a dielectric layer 800 made of a transparent insulating material and a protecting layer 900 made of magnesium oxide (MgO) or the like, all being formed on a front side glass substrate 400.

The back side substrate 200 comprises an address electrode 1000, a barrier rib 1100 and a fluorescent material layer 1200, all formed on a back side glass substrate 500. Although not shown in FIG. 9, a dielectric layer 1300 is formed on the address electrode 1000, too.

By affixing the front side substrate 100 to the back side substrate 200 so that the display electrode 600 makes an approximately right angle with the address electrode 1000, a discharge space region 300 is formed between the front side substrate 100 and the back glass side substrate 500.

In this gas discharge display device, an alternate current voltage is applied between one pair of display electrodes 600 provided on the front side substrate 100, and a voltage is applied between the address electrode 1000 provided on the back side substrate 200 and the display electrode 600, whereby an address discharge is made to occur and a main discharge is generated in a prescribed discharging cell. The main discharge generates an ultraviolet ray, which induces emission of lights from the red- green- and blue-color fluorescent materials 1200 separately coated on respective discharging cells. A display is made by emission of these lights.

Examples of such prior gas discharge display devices are described in, for instance, FLAT PANEL DISPLAY 1996 (Edited by Nikkei Microdevice, 1995), pages 208–215.

Here, the method for forming the bus electrode 700 carried on the front side substrate 100 and the address electrode 1000 carried on the back side substrate 200 will be mentioned below in more detail. FIG. 5, 8A–8O illustrate an exemplary process for forming address electrode 1000 on back side glass substrate 500. Explanation of the process for forming bus electrode 700 carried on front side substrate 100 is omitted, because it can be formed by a similar process.

First, a Cr/Cu/Cr layer (1000a–c) for forming address electrode 1000 on the back side glass substrate 500 and a resist 2500 for forming the pattern of address electrode 1000 are successively piled lamination-wise by a film-forming technique such as sputtering, evaporation, spin coating, dry filling, etc. (Step (a), FIG. 8A: Film forming step). Next, the resist 2500 is exposed to light and developed so as to form a desired pattern of address electrode 1000 (Steps (b) and (c), FIGS. 8B and 8C: Photolithographic step). Next, using an etching solution for Cr, the Cr layer 1000a is etched to form the desired pattern (Step (d), FIG. 8D: Etching step). Next, the exposed and developed resist 2500 is peeled off, and a resist 2500 is again formed (Steps (e) and (f), FIGS. 8E and 8F). The above-mentioned treatments are repeated for each of Cu layer 1000b and Cr layer 1000c (Steps (g) to (o), FIGS. 8G–8O). Thus, address electrode 1000 is formed on the back side glass substrate 500.

The above-mentioned process using an etching solution is generally called "wet etching". In the conventional wet etching processes, the resist 2500 is formed from an organic material.

Further, in the conventional formation of electrodes by wet etching, a photolithographic step for forming a resist is indispensable.

SUMMARY OF THE INVENTION

In order to reduce the number of repetition of the photolithographic steps, the present inventors have studied on a technique for forming a multi-layered wiring such as those having a structure of Cr layer 1000a/Cu layer 1000b/Cr layer 1000c, etc. by using only the resist 2500 formed by Steps (a)–(c). This technique may be realizable if an etching solution capable of selectively etching Cr layer or Cu layer is used. Actually, however, it has experimentally been revealed that Cr layers 1000a and 1000c are quite readily side-etched and accuracy of fabrication of the Cr/Cu/Cr layer is quite unstable, so far as an etching solution giving no damage to alkali-developable releasable resists is used. If a Cr layer is side-etched, the side-etched portions form gaps, which incurs inclusion of voids and contaminants such as etching solution. The contaminants cause corrosion and breakage of wiring in the step of firing the dielectric. Occurrence of breakage in the wiring means existence of wire portions not contributing to display in a gas discharge display panel, which is a fatal problem to a display panel. Since Cr/Cu/Cr layer constitutes a wiring of lower resistance as compared with other electrode materials, it is quite useful for large-sized display devices such as gas discharge display panel and the like. But, the same problem as mentioned above arises also in case of forming a multi-layer wiring such as Cr/Al/Cr by the method of wet etching.

Further, if the resist is formed of an organic material, the adhesion between resist and electrode is insufficient, which causes corrosion by etching solution at the resist interface. It has further been revealed that, in such a resist, extraneous materials and air bubbles are included to cause defects in resist, due to which corrosion and thereby caused breakage of wiring can occur. Further, since conventional resists have been formed by a photolithographic process, they are apt to have defects due to extraneous matter. If electrode is formed by wet etching from a resist including defects, the regions corresponding to the defects are similarly etched, which causes breakage of wiring. These problems arise not only in Cr/Cu/Cr type multi-layer wiring, but also in case of forming a wiring of Al, Ag, Ni, Au, etc. by wet etching.

As above, in the gas discharge display panels and wiring substrates in which electrodes are formed by the conventional wet etching technique, breakage of wiring has readily occurred due to side-etching of electrode and unexpected corrosion. Further, breakage of wiring due to defects of resist has also been apt to occur.

It is an object of this invention to suppress the breakage of wiring in the electrodes formed in wiring substrates and gas discharge display panels. In particular, the object of this invention consists in suppressing the breakage of wiring in the case of forming electrodes by wet etching process.

In order to achieve the object mentioned above, this invention forms a resist from an inorganic material in a wet etching process.

Thus, this invention forms a gas discharge display device provided with a front side substrate having a plurality of first electrodes and a back side substrate having a plurality of second electrodes, wherein at least the first electrodes or the second electrodes are formed from a resist made of an inorganic material by wet etching process.

Further, this invention forms a gas discharge display device provided with a front side substrate having a plurality of first electrodes and a first dielectric layer covering said first electrodes, a back side substrate having a plurality of electrodes and a second dielectric layer covering said second electrodes and a layer of an inorganic material layer interposed at least between said first electrodes and said first dielectric layer or between said second electrodes and said second dielectric layer, wherein said first electrodes or said second electrodes are formed by wet etching process.

Since a resist formed in the above-mentioned manner by forming an inorganic material into a film by sputtering or evaporation method has an increased adhesiveness to electrodes as compared with conventional resists made of organic material, such a resist is prevented from the corrosion by etching solution at the resist interface and thereby the breakage of wiring can be suppressed.

Further, if an inorganic material is used as resist, such a resist does not require so much consideration for etching damage as in the use of conventional resists made of organic material, so that an etching solution facilitating the control of etching quantity can be used, and the breakage of wiring due to side etching occurring in the conventional technique can be prevented by the use of inexpensive inorganic material. That is, as the inorganic material, ITO, $SiO_2$, Ni—Cr and the like can be used, for instance.

Further, since the inorganic material layer is lessened in reactivity with electrodes and dielectric layer, the inorganic layer may be made to remain between the electrodes and dielectric layer instead of releasing the inorganic layer, and this makes it possible to prevent the corrosion of electrodes and breakage of wiring due to the reaction between electrodes and dielectric layer.

For forming a resist by the use of an inorganic material layer, any means such as photolithography, blaster, laser and the like may be used.

In order to achieve the object mentioned above, this invention forms a resist by means of blaster. Thus, the gas discharge display device of this invention comprises a front side substrate having a plurality of first electrodes and a back side substrate having a plurality of second electrodes, wherein at least said first electrodes or said second electrodes have thereon a material layer formed by means of blaster and said first electrodes or second electrodes are formed from said material layer by wet etching process. In this case, the material layer serves as a resist for the first or second electrodes.

For forming the material layer, it is necessary to form a protecting layer functioning as a resist for said material layer. Since this invention forms the material layer (resist) by means of a blaster, etching solution does not permeate the interface between the protecting layer and the material layer, which lessens the risk of forming defects in the material layer (resist). This has made it possible to carry out the wet etching on a material having only a small number of defects and therefore to suppress breakage of electrodes. In addition, fabrication of a resist by means of blaster can be achieved in a short period of time at a low cost.

It should be additionally noted that, if the material layer is formed by means of laser instead of blaster, the formation of protecting layer necessary to the blaster process is unnecessary, due to which electrodes can be formed without photolithographic process and therefore the electrode-forming process can naturally be shortened to a great extent. In such an embodiment, the use of mask for forming an electrode pattern is unnecessary. Further, since in this case the material layer (resist) is formed without photolithographic process, a partial removal of the material layer by means of laser is enough for obtaining a desired pattern, which makes it possible to decrease the number of defects in resist extremely.

In these cases, the material layer (resist) may be made of any of organic material and inorganic material.

Further, in the case where blaster is used, the same fabrication as achievable by means of laser can be achieved by throttling the nozzle.

Moreover, the same processing as in the case of using a laser is possible even if the material layer (resist) is subjected to mechanical cutting to obtain a desired electrode pattern.

DETAILED DESCRIPTION OF THE INVENTION

Embodiments of this invention will be explained below by referring to the accompanying drawings.

FIGS. 1A–1H illustrate the first embodiment in which address electrodes are formed on a back side substrate.

In these drawings, 10 is a back side glass substrate, and 11a, 11b and 11c are address electrodes in which Cr/Cu/Cr layers are successively laminated. 25 is an inorganic material layer functioning as a resist, and 26 is a photoresist layer for forming a pattern of resist 25.

Figure 1A:
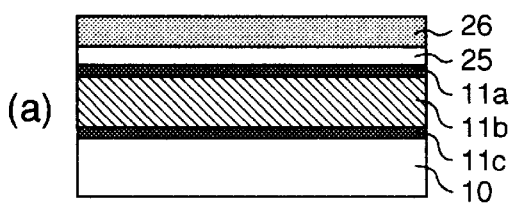
FIGS. 1A–1H are process diagrams illustrating the first embodiment of this invention.

First, Cr layer 11c, Cu layer 11b, Cr layer 11a, and ITO layer functioning as an inorganic material layer 25 are successively laminated by sputtering, and then a dry film resist functioning as photoresist 26 is laminated (Step (a), FIG. 1A).

Figure 1B:
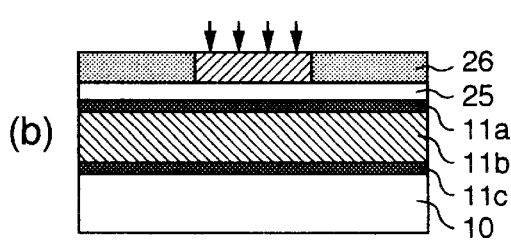

Subsequently, the photoresist 26 (dry film resist) is exposed to light and developed so as to give a desired electrode pattern, and then baked (Step (b), FIG. 1B).

Figure 1C:
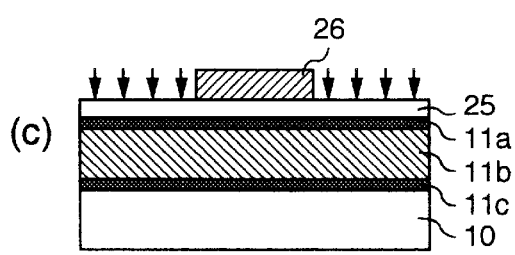
Figure 1D:
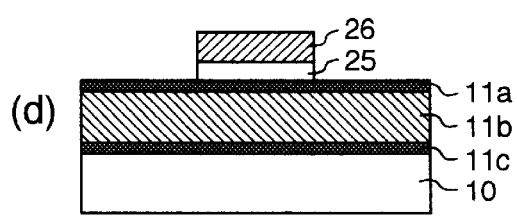

Subsequently, a blast treatment using calcium carbonate is carried out to remove the inorganic material layer 25 (ITO layer) (Steps (c) and (d), FIGS. 1C, 1D). This fabrication of resist by blast treatment makes it possible to form a pattern having an approximately same width as that of resist with a very high accuracy in a very short period of time.

Figure 1E:
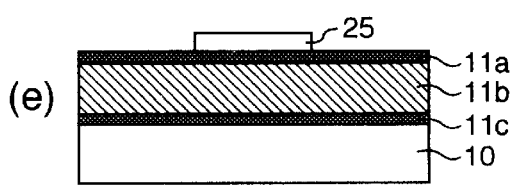

Subsequently, the photoresist 26 (dry film resist) is peeled off (Step (e), FIG. 1E). It is preferable at this time to wash away the dusts of inorganic material layer (ITO layer) formed upon the above-mentioned blast treatment.

Figure 1F:
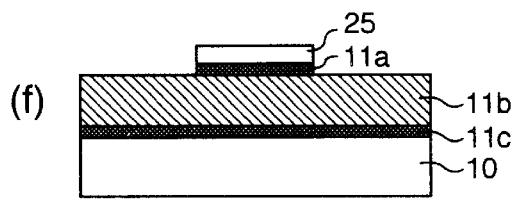

Subsequently, Cr layer 11a, is etched with an aqueous solution containing potassium permanganate and sodium metasilicate (Step (f), FIG. 1F). In this case, the above-mentioned inorganic material layer 25 (ITO layer) acts as a resist for Cr layer 11a. The aqueous solution containing potassium permanganate and sodium metasilicate is an alkaline aqueous solution which can etch the Cr layer 11a, while it scarcely etches the inorganic material layer 25 (ITO layer) and the Cu layer 11b. Thus, the inorganic material layer 25 (ITO layer) is not substantially corroded by the alkaline aqueous solution, and the Cr layer 11a, hardly undergoes side-etching throughout the formation. Further, since the adhesiveness between inorganic material layer 25 (ITO layer) and Cr layer 11a, is good, the surface of Cr layer 11a in contact with inorganic material layer 25 (ITO layer) is not corroded.

Figure 1G:
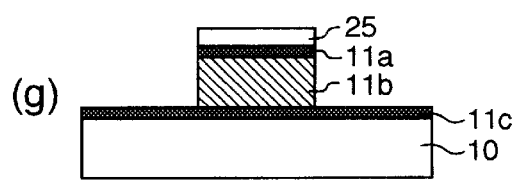

Subsequently, Cu layer 11b is etched with an aqueous solution containing ferric sulfate and sulfuric acid (Step (g), FIG. 1G). In this case, the inorganic material layer 25 (ITO layer) and the Cr layer 11a, act as a resist for Cu layer 11b. The aqueous solution containing ferric sulfate and sulfuric acid is an acidic aqueous solution which can etch the Cu layer 11b, while it hardly etches the inorganic material layer 25 (ITO layer) and the Cr layer 11a. Thus, Cr layer 11a, and Cu layer 11b are scarcely side-etched throughout the formation.

Figure 1H:
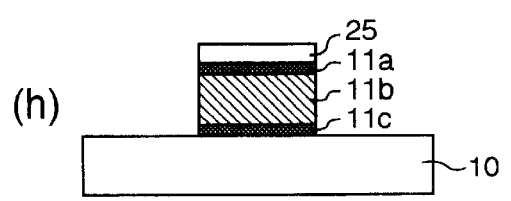

Subsequently, Cr is again etched with an aqueous solution containing potassium permanganate and sodium metasilicate to form an electrode wiring having a constitution of Cr/Cu/Cr/ITO (Step (h), FIG. 1H).

By the process mentioned above, there can be obtained an electrode wiring having a constitution of Cr/Cu/Cr/ITO and including suppressed breakage.

As above, by using inorganic material layer 25 (ITO layer) as a resist, a sufficient adhesiveness can be ensured between inorganic material layer 25 (ITO layer) and Cr layer 11a, and the corrosion of electrodes and breakage of wiring caused by etching solution at the resist interface can be suppressed. Further, the resist defects of inorganic material layer 25 caused by inclusion of extraneous matter and air bubbles can be lessened, and the corrosion of electrodes and breakage of wiring caused by etching solution can be suppressed.

Further, the use of inorganic material layer 25 as a resist broadens the scope of selection of etching solution, and the side-etching of Cr layers 11a, and 11c in the conventional technique can be suppressed. Further, consideration of the etching damage to resist has become unnecessary.

Further, the use of blaster such as sandblast and the like in place of conventional etching solutions makes it possible to suppress the resist defects in inorganic material layer 25. That is, since there is no permeation of etching solution through the interface between photoresist 26 and inorganic material layer, the possibility of forming defects in inorganic material layer 25 (resist) is not great. By carrying out a wet etching process using such a inorganic material layer 25 (resist) small in the number of defects, the breakage of electrodes can be suppressed.

Further, in this electrode-forming process, Cr layer is etched with an alkaline aqueous solution. In the conventional technique for forming alkali-resistant organic resist by photolithographic process, the developing solution and peeling solution for the organic resist have been expensive and have caused environmental pollution. On the other hand, in the process of this invention employing an inorganic resist, the resist is lessened in reactivity with electrodes and dielectric, and therefore a step for peeling off the resist is unnecessary and no peeling solution is needed. Further, since inorganic resist is formed by means of blaster in place of photolithographic process, the use of developer for alkali-resistant organic resist is also unnecessary. In other words, there is no problem concerning developing solution and peeling solution for organic resist, unlike in the conventional techniques.

Next, FIGS. 2A–2L illustrate the second embodiment for forming address electrodes on a back side substrate.

In the embodiment of FIG. 1, it has been revealed that a small quantity of etching solution for Cu layer can remain in the defective portions such as pin-holes of inorganic material layer 25 (ITO layer) in the etching process of Cu layer 11b to corrode Cu layer in the subsequent steps. Accordingly, in FIG. 2, electrodes are formed by the following processes.

First, by the same processes as in FIG. 1, Cr layer 11a, is etched (Steps (a)–(f), FIGS. 2A–2F).

Figure 2A:
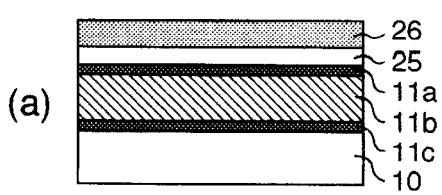
FIGS. 2A–2L are process diagrams illustrating the second embodiment of this invention.
Figure 2B:
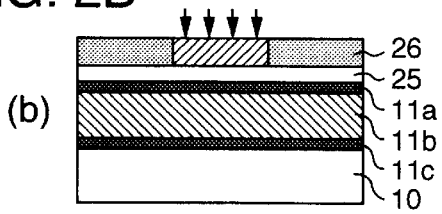
Figure 2C:
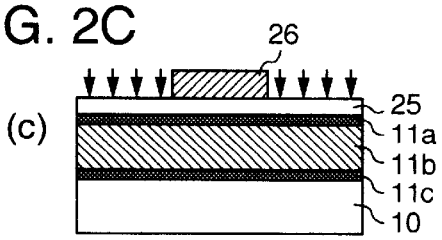
Figure 2D:
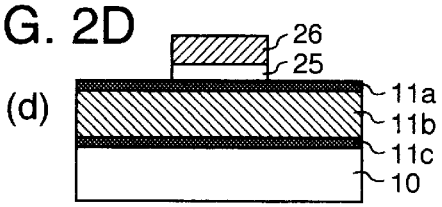
Figure 2E:
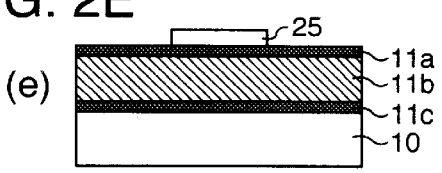
Figure 2F:
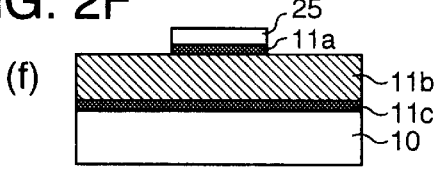
Figure 2G:
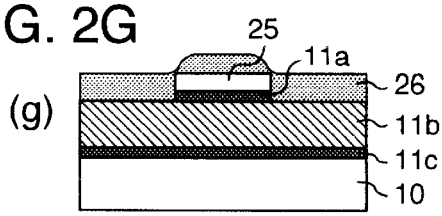
Figure 2H:
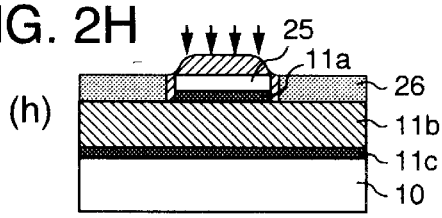
Figure 2I:
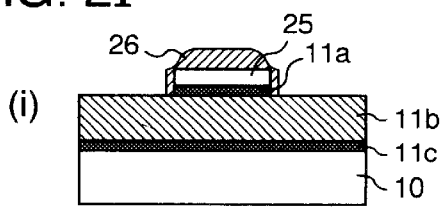
Figure 2J:
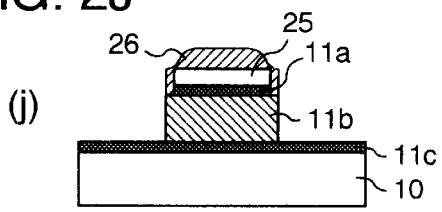
Figure 2K:
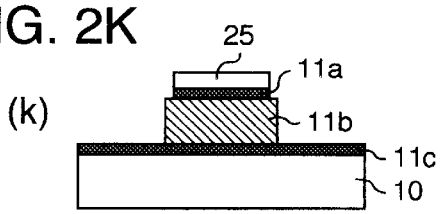
Figure 2L:
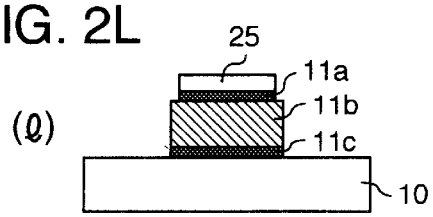

Subsequently, photoresist 26 (dry film resist) not corroded by an etching solution for Cu is laminated on an inorganic material layer 25 (ITO layer) (Step (g), FIG. 2G) and then exposed to light so as to make a pattern covering the inorganic material layer 25 (ITO layer) and developed (Step (h), FIG. 2H). Then, the unexposed portion of photoresist 26 (dry film resist) is removed (Step (i), FIG. 2I), and the Cu layer 11b is etched with the same etching solution as in FIG. 1 (Step (j), FIG. 2J). Thereafter, the photoresist 26 (dry film resist) is peeled off (Step(k), FIG. 2K). The subsequent processes are carried out in the same manner as in FIG. 1.

By the above-mentioned treatment, the etching solution for Cu becomes unable to remain in the defects, such as pin-holes, in the inorganic material layer 25 (ITO layer), by which the corrosion of Cu layer in the subsequent steps can be suppressed.

Next, FIGS. 3A–3G illustrate the third embodiment in which address electrodes are formed on the back side substrate.

Figure 3A:
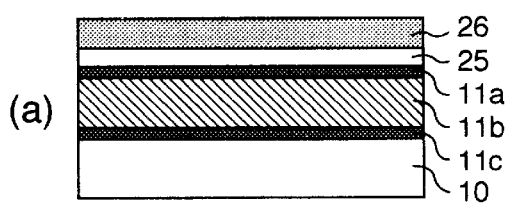
FIGS. 3A–3G are process diagrams illustrating the third embodiment of this invention.
Figure 3B:
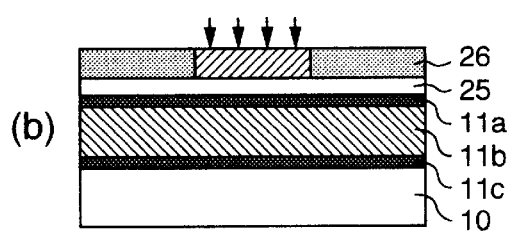
Figure 3C:
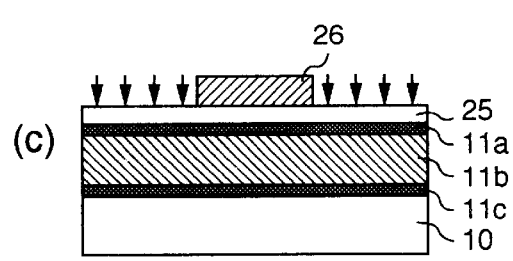
Figure 3D:
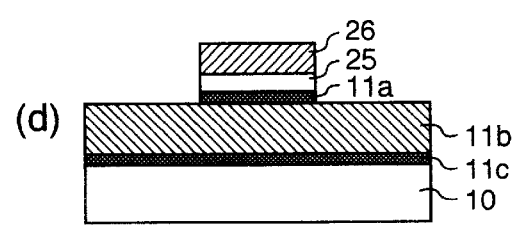
Figure 3E:
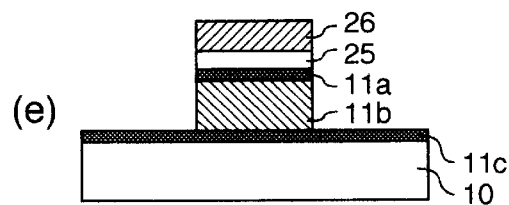
Figure 3F:
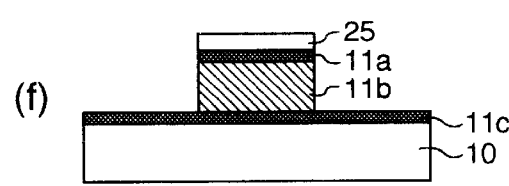
Figure 3G:
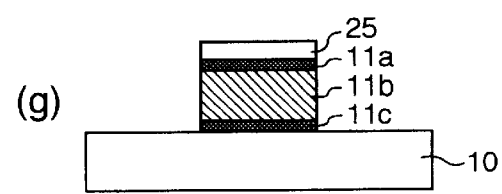

This embodiment is the same as that of FIG. 1, except that the blast treatment using calcium carbonate is carried out not only on the inorganic material layer 25 (ITO layer) but also on the Cr layer 11a, (Step (d), FIG. 3D), and after etching the Cu layer 11b (Step (e), FIG. 3E) the photoresist 26 (dry film resist) is peeled off (Step (f), FIG. 3F). Accordingly, the photoresist 26 (dry film resist) is selected from materials not etched by the etching solution for Cu layer 11b.

In the above-mentioned treatment, the step for etching Cr layer 11a, can be eliminated, and the electrode-forming process can be simplified. Further, if the efficiencies of blast process and wet etching process are taken into consideration, it is preferable to fabricate down to the Cr layer 11a by blast process because of the material characteristics of Cu layer 11b and film thickness thereof. As above, an electrode formation by combination of a dry etching method such as blast process and a wet etching method is effective for simplification of process and prevention of breakage of wiring.

Next, FIGS. 4A–4E illustrate the fourth embodiment in which address electrodes are formed on a back side substrate.

FIG. 4 is an example of forming electrodes without using photolithographic process.

Figure 4A:
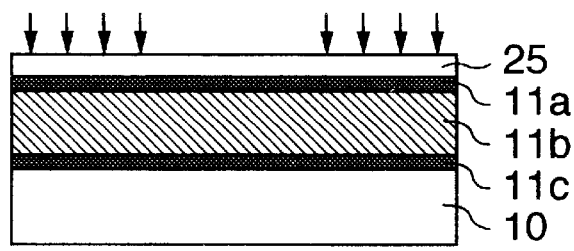
FIGS. 4A–4E are process diagrams illustrating the fourth embodiment of this invention.

First, Cr layer 11c, Cu layer 11b, Cr layer 11a, and ITO layer functioning as an inorganic material layer 25 are successively formed on a glass substrate 10 by sputtering (Step (a), FIG. 4A).

Figure 4B:
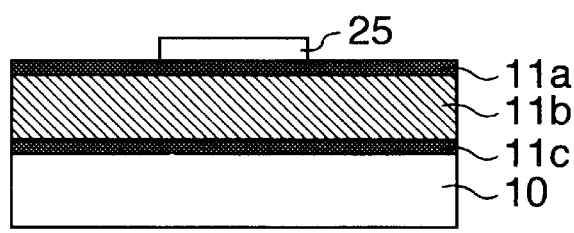

Subsequently, the inorganic material layer 25 (ITO layer) is removed by means of laser so as to give a desired electrode pattern (Step (b), FIG. 4B).

Figure 4C:
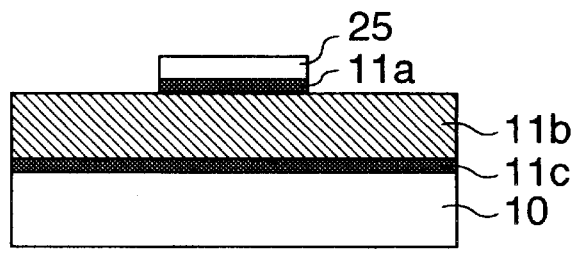
Figure 4D:
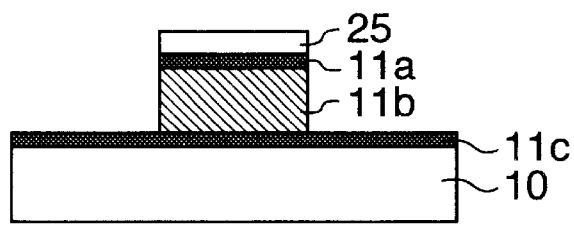
Figure 4E:
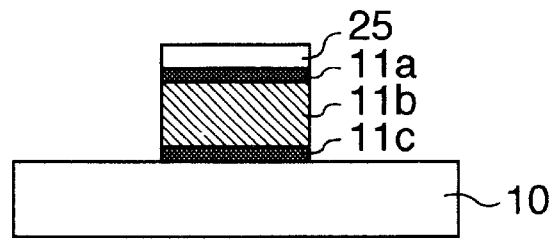
Figure 5A:
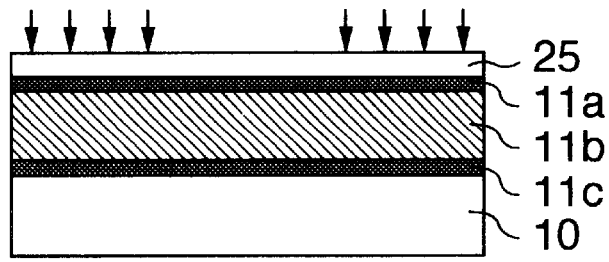
FIGS. 5A–5D are process diagrams illustrating the fifth embodiment of this invention.
Figure 5B:
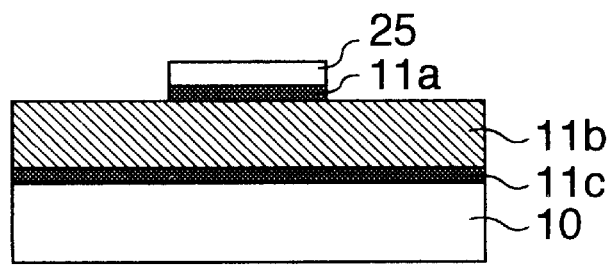
Figure 5C:
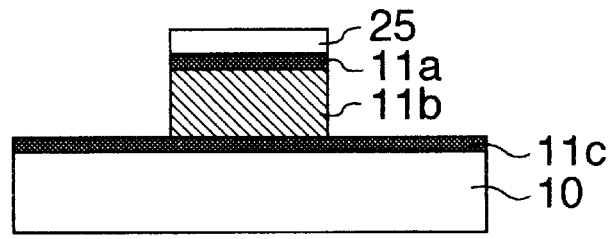
Figure 5D:
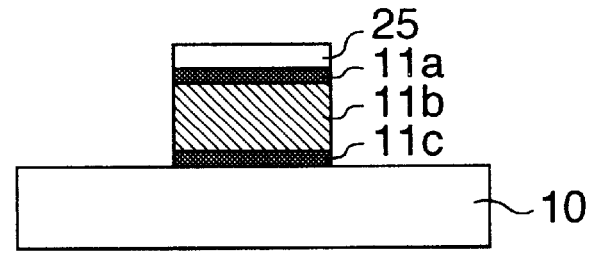

Thereafter, Cr layer 11a, Cu layer 11b and Cr layer 11c are successively etched in the same manner as in FIG. 1 to form an electrode wiring (Steps (c)–(e), FIGS. 4C–4E).

As above, a resist can be formed by using a laser, without such photolithographic steps as shown in FIGS. 1–3, by which the electrode-forming process can be simplified greatly. Further, the mask for forming electrodes becomes unnecessary.

Since there is no photolithographic process, the resist defects due to unexposed portions caused by adhesion of extraneous matter can be eliminated, so that the breakage of wiring at the time of wet etching caused by the resist defects can be suppressed. That is to say, an electrode-forming process resistant to extraneous matter can be realized.

It is also possible to subject the layers of down to Cr 11a, to laser fabrication, if desired, as shown in FIG. 3. This method is realizable as understandable from thickness of Cr layer, and an experiment has actually proved that a fabrication of high accuracy can be achieved by this method. The process is as shown in FIGS. 5A–5D.

It has been revealed that, in the processes of FIGS. 4 and 5, a very small quantity of etching solution for Cu layer 11b can remain in the defective portions such as pin-holes of inorganic material layer 25 (ITO layer) in the etching process of Cu layer 11b and this remaining etching solution corrodes the Cu layer in the subsequent steps. In order to solve this problem, in the embodiment shown by FIGS. 6A–6E, electrodes are formed by the following process. FIG. 6 is explained by imagining the process of FIG. 5.

Figure 6A:
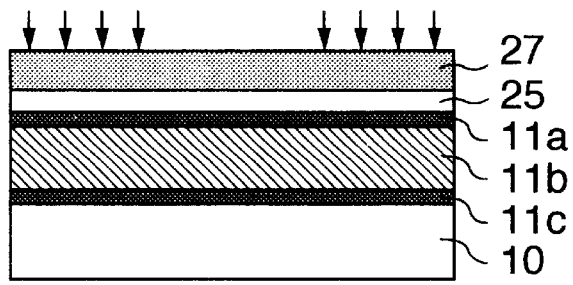
FIGS. 6A–6E are process diagrams illustrating the sixth embodiment of this invention.

First, Cr layer 11c, Cu layer 11b and Cr layer 11a, are successively formed on glass substrate 10 by sputtering, after which thereon are formed an ITO layer functioning as inorganic material layer 25 and a resist 27 not corroded by the etching solution for Cu layer 11b (Step (a), FIG. 6A).

Figure 6B:
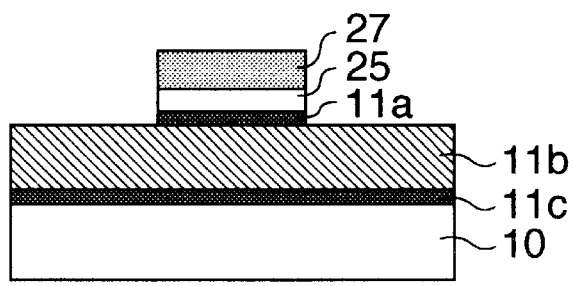
Figure 6C:
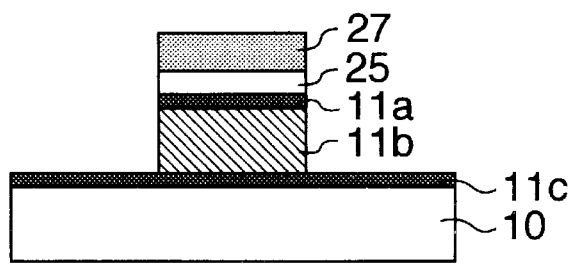

Subsequently, resist 27, inorganic material layer 25 and Cr layer 11a, are removed by means of laser so as to give a desired electrode pattern (Step (b), FIG. 6B). Since resist 27 is formed by means of laser as above, there is no need to use such a photosensitive material as used in conventional photolithographic process as a material of resist 27.

Subsequently, Cu layer 11b is etched in the presence of resist 27 by the use of an aqueous solution containing ferric sulfate and sulfuric acid (Step (c), FIG. Since the inorganic material layer 25 is covered with resist 27, the inorganic material layer 25 is not readily corroded.

Figure 6D:
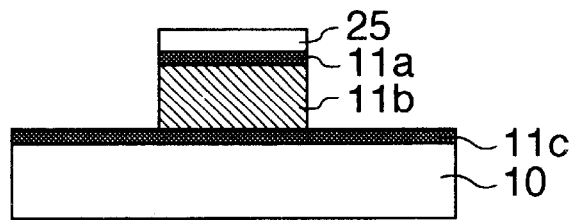

Then, the resist 27 is peeled off, and the Cr layer 11c is etched with an aqueous solution containing potassium permanganate and sodium metasilicate (Step (d), FIG. 6D). If desired, the resist 27 may be peeled off after Step (e).

Figure 6E:
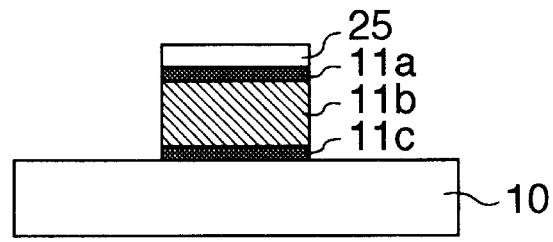

By the above-mentioned process, an electrode wiring having a constitution of Cr/Cu/Cr/ITO and lessened in the risk of wiring breakage caused by side-etching can be obtained (Step (e), FIG. 6E).

After this treatment, no etching solution for Cu remains in the inorganic material layer 25 (ITO layer), and corrosion of Cu layer in the subsequent steps can be suppressed.

Next, there is explained an electrode with lower cost by reducing side etching and reducing the number of steps comparing with the above-mentioned embodiments.

FIGS. 10A to 10D show the seventh embodiment of the present invention wherein the electrode is formed by reducing the number of film formation by sputtering, etc. and aiming at a lower production cost.

Figure 10A:
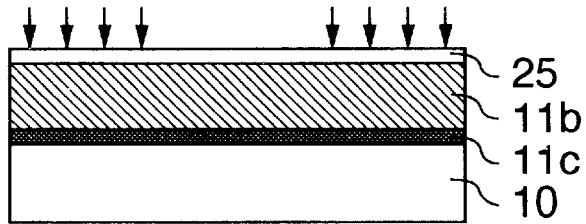
FIGS. 10A to 10D are process diagrams illustrating the seventh embodiment of the present invention.

First, Cr layer 11c, Cu layer 11b and an alloy layer of Ni and Cr as an inorganic material layer 25 are formed on a glass substrate 10 by sputtering (Step (a), FIG. 10A). Since the alloy layer of Ni and Cr is used, selective etching of the Cr layer 11c and Cu layer 11b becomes possible in a later step. Further, the alloy layer of Ni and Cr can easily be subjected to laser processing.

Figure 10B:
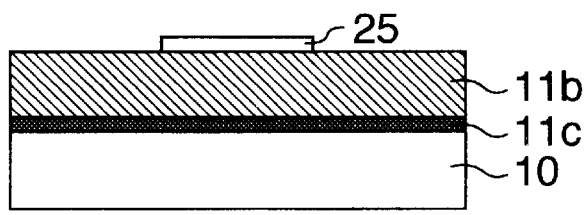

Then, the inorganic material layer 25 (the alloy layer of Ni and Cr) is removed by using a laser so as to give a desired electrode pattern (Step (b), FIG. 10B). Needless to say, it is possible to employ the above-mentioned blast treatment.

Figure 10C:
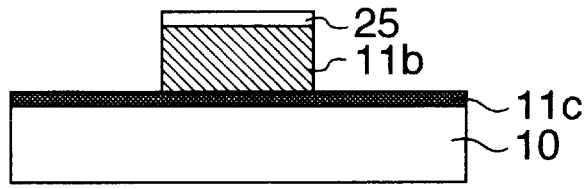
Figure 10D:
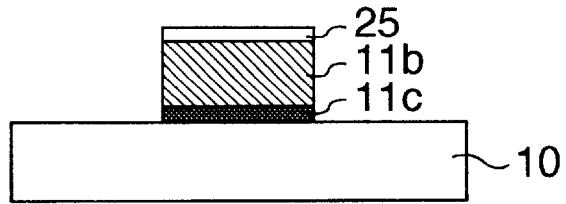

Subsequently, the Cu layer 11b and the Cr layer 11c are etched in this order in the same manner as shown in FIG. 3 to form an electrode wiring (Steps (c) and (d), FIGS. 10C and 10D).

This electrode construction does not require the Cr layer 11a, mentioned in the above-mentioned embodiments, and thus can omit the film forming step of the Cr layer 11a, resulting in making it possible to further reduce the production cost. Further, the electrode comprising the Cr layer 11c, the Cu layer 11b and the Ni—Cr alloy layer is effective for preventing wire breaking caused by side etching, as well as for increasing the adhesiveness between the Cr layer 11c and the substrate 10, making the resistance lower by the Cu layer 11b, and preventing the reaction with a dielectric layer (not shown in the drawing) by the Ni—Cr alloy layer, so that requirements demanded for a plasma display panel can be satisfied. It is possible to use $SiO_2$, ITO Si, Ni, etc. in place of the Ni—Cr alloy layer.

FIGS. 11A to 11D show eighth embodiment of the present invention wherein the electrode is formed by reducing the number of film formation by sputtering, etc. and using a thickened Cr layer as the inorganic material layer 25.

Figure 11A:
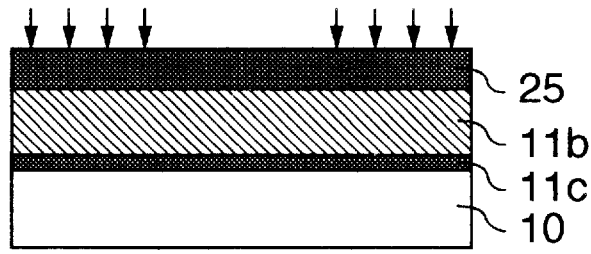
FIGS. 11A to 11D are process diagrams illustrating the eighth embodiment of the present invention.

First, a Cr layer 11c, a Cu layer 11b and a thick Cr layer which is to become an inorganic material layer 25 are formed in this order by sputtering on a glass substrate 10 (Step (a), FIG. 11A). The thickness of the Cr layer 25 is preferably 3 times or more compared with the thickness of the Cr layer 11c, in order to set the process conditions mentioned below easier.

Figure 11B:
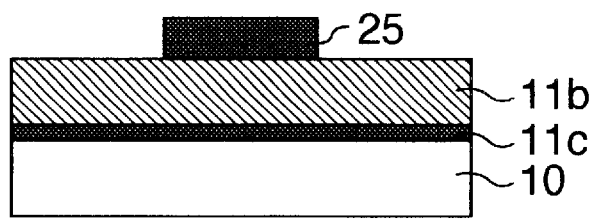

Then, the thick Cr layer (used as an inorganic material layer 25) is removed using a laser to give a desired electrode pattern (Step (b), FIG. 11B). Needless to say, the blast processing can be used as mentioned in the above-mentioned embodiments.

Figure 11C:
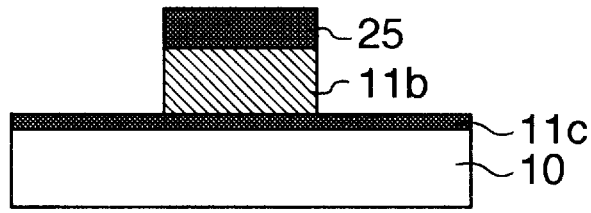
Figure 11D:
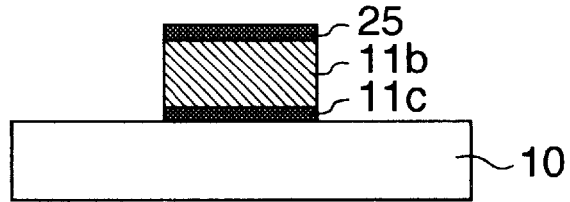

Subsequently, the Cu layer 11b and the Cr layer 11c are etched in this order in the same manner as shown in FIG. 3 to form an electrode wiring (steps (c) and (d), FIGS. 11C and 11D).

In this case, when the Cr layer 11c is etched, the thick Cr layer (inorganic material layer 25) is also etched to reduce the thickness, but by making the thickness of the thick Cr layer (inorganic material layer 25) sufficiently larger than that of the Cr layer 11c, it is possible to form an electrode having no problem in reliability. Further, by making the thickness of the thick Cr layer larger, pin holes are hardly formed in the thick Cr layer, resulting in reducing the residual amount of an etching solution for the surface of the Cu layer 11b. This makes it possible to prevent corrosion of the Cu layer in later steps due to the remaining etching solution.

By making the thickness of the Cr layer 25 larger, even if there is no selectivity for etching of the underlayer Cu layer 11b and the Cr layer 11c, the electrode can be formed by a combination of dry etching such as a conventional layer processing and wet etching.

Next, one example of the gas discharge display panel formed by the above-mentioned electrode-forming processes will be explained by referring to FIG. 7.

Figure 7A:
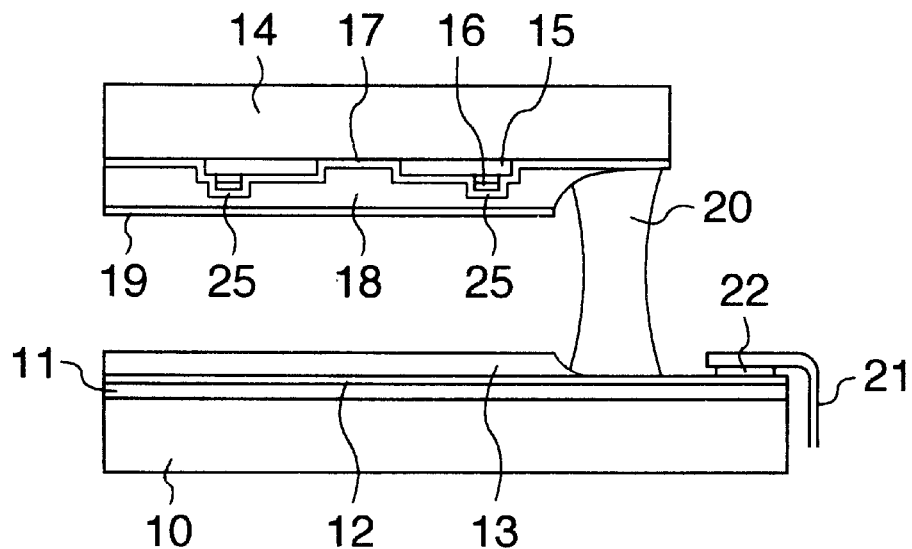
FIGS. 7A and 7B are sectional views illustrating the gas discharge display device of this invention.
Figure 7B:
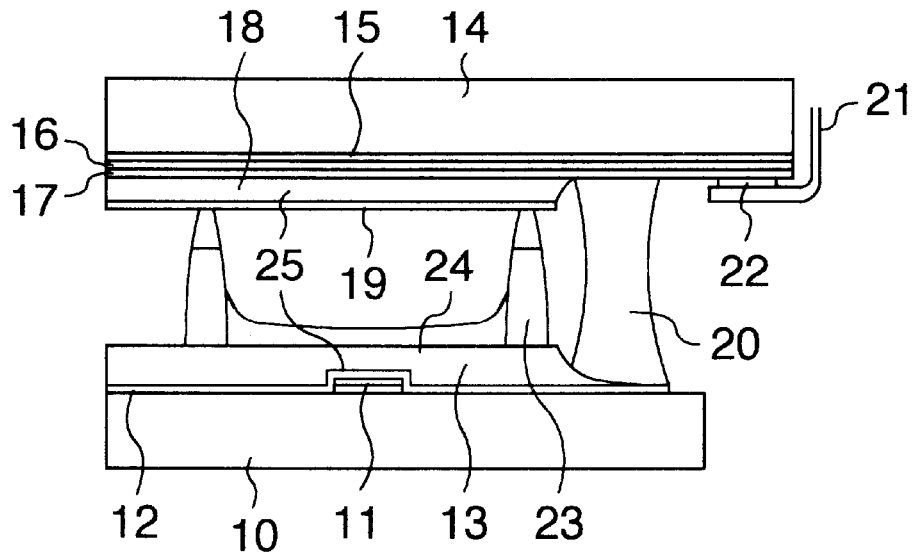
Figure 8A:
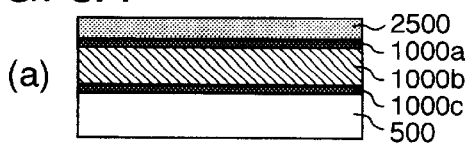
FIGS. 8A–8O are diagrams illustrating the conventional process.
Figure 8B:
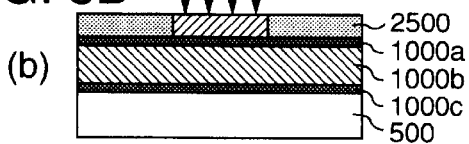
Figure 8C:
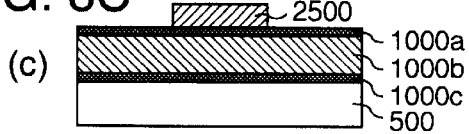
Figure 8D:
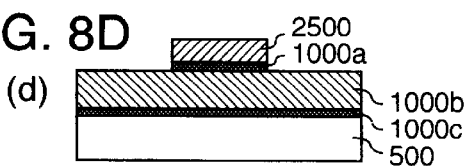
Figure 8E:
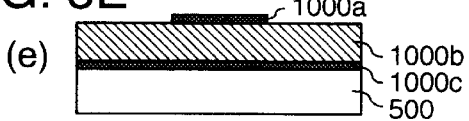
Figure 8F:
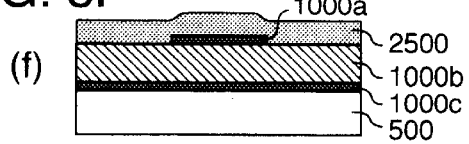
Figure 8G:
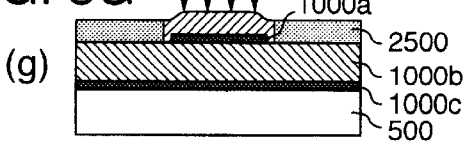
Figure 8H:
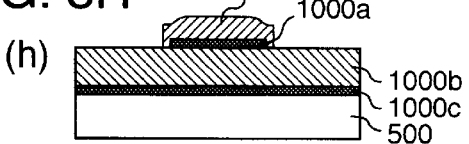
Figure 8I:
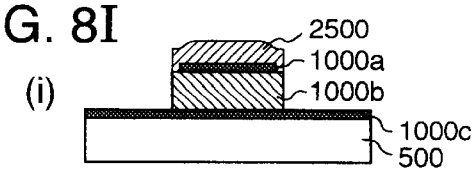
Figure 8J:
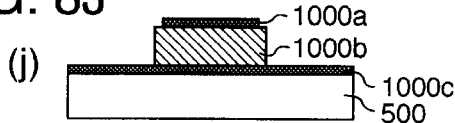
Figure 8K:
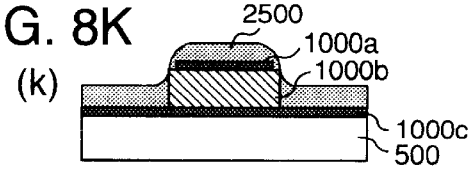
Figure 8M:
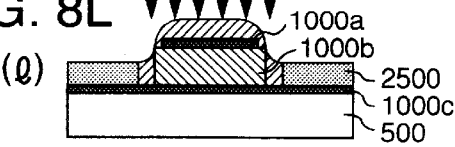
Figure 8M:
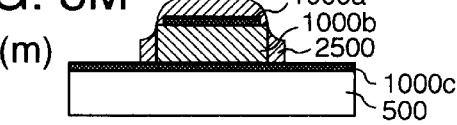
Figure 8N:
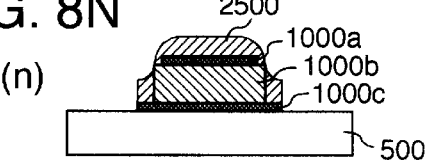
Figure 8O:
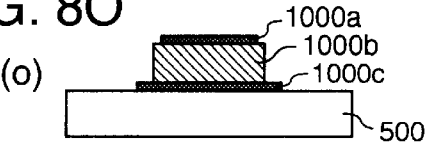
Figure 9:
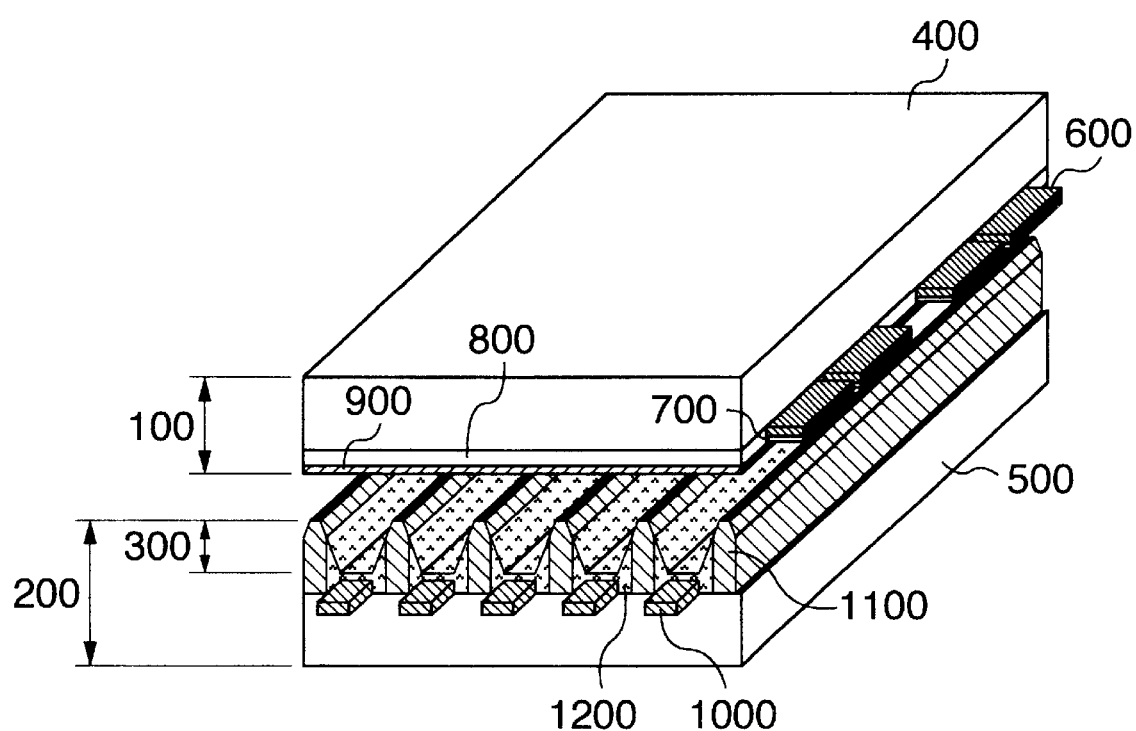
FIG. 9 is a sectional view illustrating a conventional gas discharge display device.

FIGS. 7A and 7B illustrate a gas discharge display panel, provided that FIG. 7A is a sectional view parallel to address electrodes and FIG. 7B is a sectional view perpendicular to the address electrodes. The above-mentioned electrode-forming processes are applied to both of front side substrate and back side substrate.

In these drawings, 10 is a back side glass substrate, 11 is an address electrode, 12 is a thin film dielectric layer such as $SiO_2$, 13 is a thick film dielectric layer, 14 is a front side glass substrate, 15 is a transparent electrode such as ITO, 16 is a bus electrode such as Cr—Cu—Cr, 17 is a thin film dielectric layer such as $SiO_2$, 18 is a thick film dielectric layer, 19 is a protecting film made of, for example, MgO, 20 is a sealing member, 21 is an electrode connected from the external circuit, 22 is an anisotropic conductive sheet containing conductive particles, 23 is a partition wall, 24 is a fluorescent material layer, and 25 is an inorganic material layer functioning as a resist at the time of electrode formation.

A front side substrate can be formed in the following manner.

First, a transparent electrode 15 is formed on a glass substrate 14. The transparent electrode 15 may be formed by any means of wet etching, blaster and laser. The use of laser is preferred from the viewpoint of simplification of the process. Subsequently, a bus electrode 14 is formed on the transparent electrode 15 according to the above-mentioned electrode-forming process of this invention. At this time, the above-mentioned inorganic material layer 25 exists on the bus electrode 16. Subsequently, a thin film dielectric layer 17 is formed so as to cover at least the transparent electrode 15 and the bus electrode 16. For instance, the thin film dielectric layer 17 is formed on the whole panel surface. Subsequently, a thick film dielectric layer 18 is formed on the thin film dielectric layer 17 by the thick film printing technique.

Subsequently, a protecting film 19 made of MgO or the like is formed on the thick film dielectric layer 18 by the technique of evaporation. In the case of front side substrate, the transparent electrode 15 is formed under the bus electrode 16, and the transparent electrode 15 is usually an ITO layer. Accordingly, it is allowable, if desired, to form the bus electrode 16 including the transparent electrode 15 and the inorganic material layer 25 according to a series of wet etching processes by applying the electrode-forming process of this invention. In this case, ITO/Cr/Cu/Cr/ITO are successively formed, and then Cr/Cu/Cr/ITO functioning as bus electrode 16 is formed by any of the above-mentioned electrode-forming processes of this invention. Subsequently, a resist capable of making the ITO layer, functioning as transparent electrode 15, into a desired pattern is formed, and the ITO layer is etched by the use of this resist and then the resist is peeled off to form a transparent electrode 15 and a bus electrode 16. The inorganic material layer 25 may be made of $SiO_2$ or Ni—Cr, if desired.

On the other hand, a back side substrate is formed in the following manner.

First, an address electrode 11 is formed on a glass substrate 10 according to the electrode-forming process of this invention. Subsequently, a thin film dielectric layer 12 is formed so as to cover at least the address electrode 11. For instance, the thin film dielectric layer 12 is formed on the whole panel surface. Subsequently, a thick film dielectric layer 13 is formed on the thin film dielectric layer 12 according to the thick film printing technique. Subsequently, on the thick film dielectric layer 13, a partition wall 23 is formed and further a fluorescent material layer 24 is formed thereon by the printing technique. The partition wall 24 may be formed as stripes parallel to the address electrode or as grids surrounding the display cell.

After adjusting the positions of the front side substrate and the back side substrate formed above, they are sealed by means of a sealing member 21. The atmosphere of the sealed space contains a rare gas. The electrode 21 leading to the external circuit is connected via an external connection terminal of the front side substrate and an anisotropic conductive sheet of the back side substrate, in order to simplify the connecting process.

As above, the inorganic material layer 25 is free from the risk of reaction with address electrode 11, dielectric layer 18, bus electrode 16 and dielectric layer 13, and therefore the inorganic material layer can be left to remain without peeling. This makes it possible to suppress the reactions between address electrode 11 and dielectric layer 18 and between the bus electrode 16 and the dielectric layer 13, and thereby to prevent the corrosion of address electrode 11 and bus electrode 16. Accordingly, there arises no problem, if the thin film dielectric layer 12 is not formed.

As above, as a result of forming the bus electrode and address electrode as a Cr/Cu/Cr/ITO layer or a Cr/Cu/Cr/$SiO_2$ layer, or a Cr/Cu/Cr/Ni—Cr layer, the breakage of wiring due to various causes can be lessened.

For further lessening the breakage of wiring, a different resist may be used in either of Cr layer 11a, Cu layer 11b and Cr layer 11c. Another allowable means for achieving this object is to form the inorganic material layer into a double layer structure having a constitution of Cr/Cu/Cr/ITO/$SiO_2$.

It is needless to say that, in the embodiments described above, the same effect as above can be obtained if the Cr/Cu/Cr electrode wiring is replaced by Cr/Al/Cr, Ag, Ni, Au, Al, etc. That is to say, it is needless to say that the same effect as above can be obtained if the materials used therein are those satisfying the conditions required of a gas discharge display panel. It is also needless to say that the electrode to be formed is not restricted to the address electrode but the same effect as above can be obtained by forming the bus electrode of the front side substrate as shown in FIG. 7. Further, it is needless to say that this invention can be applied not only to gas discharge display panel but also to all the wiring substrates in which electrodes are formed by wet etching technique.

It is also needless to say that the corrosion of electrode at the resist interface can be prevented even if neither blaster nor laser is used, so far as the inorganic material layer 25 (resist) is present. Conversely, it is also needless to say that defects of resist can be suppressed even if the resist is not made of an inorganic material, so far as the resist is formed by means of blaster or laser.

As above, according to this invention, the breakage of wire in the electrodes formed in wiring substrate or gas discharge display device can be suppressed. Especially, the breakage of wire occurring in the case of forming electrodes by wet etching technique can be suppressed.

What is claimed is:

1. A process for producing a wiring substrate, comprising the steps of:
    forming a first material layer which becomes a first electrode;
    forming a second material layer on the first material layer;
    forming a pattern by dry etching of the second material layer; and
    forming the first electrode by wet etching of the first material layer using the pattern as a resist.

2. A process according to claim 1, wherein the pattern is formed by using a blaster to effect the dry etching.

3. A process according to claim 1, wherein the pattern is formed by using a laser to effect the dry etching.

4. A process according to claim 1, wherein the first material layer is a laminate of a Cr layer, a Cu layer and a Cr layer in this order, the pattern is formed by dry etching of the second material layer and the uppermost Cr layer in the first material layer, and the first electrode is formed by wet etching of the Cu layer and the Cr layer in the first material layer using the pattern as a resist.

5. A process according to claim 4, wherein the pattern is formed from the second material layer and the uppermost Cr layer in the first material layer by using a blaster to effect the dry etching.

6. A process according to claim 5, wherein the Cr layers in the first material layer are subjected to wet etching using an alkaline etching solution.

7. A process according to claim 4, wherein the pattern is formed from the second material layer and the uppermost Cr layer in the first material layer by using a laser to effect the dry etching.

8. A process according to claim 7, wherein the Cr layers in the first material layer are subjected to wet etching using an alkaline etching solution.

9. A process according to claim 4, wherein the Cr layers in the first material layer are subjected to wet etching using an alkaline etching solution.

10. A process according to claim 1, wherein the first material layer comprises two or more inorganic material layers.

11. A process according to claim 1, wherein the first material layer is an indium tin oxide layer or a $SiO_2$ layer.

12. A process according to claim 1, wherein the first electrode is made of Cr/Cu/Cr/ITO, Cr/Cu/Cr/$SiO_2$ or Cr/Cu/Cr/ITO/$SiO_2$.

13. A process for producing a gas discharge display device comprising a front side substrate having a plurality of first electrodes and a back side substrate having a plurality of second electrodes, comprising the steps of:
    forming a first material layer which becomes a first electrode or a second electrode;
    forming a second material layer on the first material layer;
    forming a pattern by dry etching of the second material layer using a laser; and
    subjecting the first material layer to wet etching using the pattern as a resist to form the first electrodes or the second electrodes.

14. A process according to claim 13, wherein the first material layer is a laminate of a Cr layer, a Cu layer and a Cr layer in this order, the pattern is formed by dry etching of the second material layer and the uppermost Cr layer in the first material layer using a laser, and the first electrode or the second electrode is formed by wet etching of the Cu layer and the Cr layer in the first material layer using the pattern as a resist.

15. A process according to claim 14, wherein the Cr layers in the first material layer are subjected to wet etching using an alkaline etching solution.

16. A process according to claim 13, wherein the first material layer comprises two or more inorganic material layers.

17. A process according to claim 13, wherein the first material layer is an indium tin oxide layer or a $SiO_2$ layer.

18. A process according to claim 13, wherein the first electrode is made of Cr/Cu/Cr/ITO, Cr/Cu/Cr/$SiO_2$ or Cr/Cu/Cr/ITO/$SiO_2$.

19. A process for producing a gas discharge display device comprising a front side substrate having a plurality of first electrodes and a back side substrate having a plurality of second electrodes, comprising the steps of:
    forming a first material layer which becomes a first electrode or a second electrode,
    forming a second material layer on the first material layer;
    forming a pattern by dry etching of the second material layer using a blaster; and
    a step of subjecting the first material layer to wet etching using the pattern as a resist to form the first electrodes or the second electrodes.

20. A process according to claim 19, wherein the first material layer is a laminate of a Cr layer, a Cu layer and a Cr layer in this order, the pattern is formed by dry etching of the second material layer and the uppermost Cr layer in the first material layer using a blaster, and the first electrode or the second electrode is formed by wet etching of the Cu layer and the Cr layer in the first material layer using the pattern as a resist.

21. A process according to claim 20, wherein the Cr layers in the first material layer are subjected to wet etching using an alkaline etching solution.

22. A process according to claim 19, wherein the first material layer comprises two or more inorganic material layers.

23. A process according to claim 19, wherein the first material layer is an indium tin oxide layer or a $SiO_2$ layer.

24. A process according to claim 19, wherein the first electrode is made of Cr/Cu/Cr/ITO, Cr/Cu/Cr/$SiO_2$ or Cr/Cu/Cr/ITO/$SiO_2$.

* * * * *